(12) United States Patent
Lee et al.

(10) Patent No.: US 12,295,160 B2
(45) Date of Patent: May 6, 2025

(54) SUPERJUNCTION SEMICONDUCTOR DEVICE AND METHOD FOR MANUFACTURING SAME

(71) Applicant: DB HiTek Co., Ltd., Bucheon-si (KR)

(72) Inventors: Jae Hyun Lee, Seoul (KR); Myeong Bum Pyun, Incheon (KR)

(73) Assignee: DB HiTek Co., Ltd., Bucheon-si (KR)

( * ) Notice: Subject to any disclaimer, the term of this patent is extended or adjusted under 35 U.S.C. 154(b) by 483 days.

(21) Appl. No.: 17/718,082

(22) Filed: Apr. 11, 2022

(65) Prior Publication Data

US 2022/0336579 A1    Oct. 20, 2022

(30) Foreign Application Priority Data

Apr. 16, 2021   (KR) .......................... 10-2021-0049522

(51) Int. Cl.
| | | |
|---|---|---|
| H10D 62/10 | (2025.01) | |
| H01L 21/761 | (2006.01) | |
| H10D 30/01 | (2025.01) | |
| H10D 30/66 | (2025.01) | |
| H10D 62/17 | (2025.01) | |

(52) U.S. Cl.
CPC .......... *H10D 62/111* (2025.01); *H01L 21/761* (2013.01); *H10D 30/0291* (2025.01); *H10D 30/66* (2025.01); *H10D 62/393* (2025.01)

(58) Field of Classification Search
CPC ............... H01L 21/761; H01L 29/1095; H01L 29/66712; H01L 29/7802
See application file for complete search history.

(56) References Cited

U.S. PATENT DOCUMENTS

| | | |
|---|---|---|
| 7,301,203 B2 | 11/2007 | Lee et al. |
| 7,655,981 B2 | 2/2010 | Lee et al. |
| 8,928,077 B2 | 1/2015 | Lee et al. |
| 2005/0116313 A1 | 6/2005 | Lee et al. |
| 2008/0211053 A1 | 9/2008 | Lee et al. |
| 2009/0079002 A1* | 3/2009 | Lee .................. H01L 21/26513 257/E23.001 |
| 2015/0084124 A1* | 3/2015 | Saito .................. H01L 29/4236 257/330 |
| 2022/0293746 A1* | 9/2022 | Du ...................... H01L 29/0619 |

FOREIGN PATENT DOCUMENTS

| | | |
|---|---|---|
| KR | 10-2005-0052597 A | 6/2005 |
| KR | 10-2010-0083153 A | 7/2010 |
| KR | 10-2019-0103486 A | 9/2019 |
| WO | 2012149195 A1 | 11/2012 |

OTHER PUBLICATIONS

Udrea et al., Superjunction Power Devices, History, Development, and Future Prospects, IEEE Transactions on Electron Devices, vol. 64, No. 3, Mar. 2017, pp. 713-727 (Year: 2017).*

* cited by examiner

Primary Examiner — Shih Tsun A Chou
(74) Attorney, Agent, or Firm — Andrew D. Fortney; Central California IP Group, P.C.

(57) ABSTRACT

Disclosed is a superjunction semiconductor device (1) and a method for manufacturing the same and, more particularly, to a superjunction semiconductor device (1) and a method for manufacturing the same seeking to improve breakdown voltage characteristics of the device by effectively dispersing a lateral electric field in a ring region R in the lower portion of an epitaxial layer by forming first conductivity type floating impurity-doped regions in the lower portion of the epitaxial layer in the ring region R under a p-rich condition.

8 Claims, 9 Drawing Sheets

SUPERJUNCTION SEMICONDUCTOR DEVICE AND METHOD FOR MANUFACTURING SAME

TECHNICAL FIELD

The present disclosure relates to a superjunction semiconductor device and a method for manufacturing the same and, more particularly, to a superjunction semiconductor device and a method for manufacturing the same seeking to improve breakdown voltage characteristics of the device by effectively dispersing a lateral electric field in a ring region R (e.g., in the lower portion of an epitaxial layer) by forming first conductivity type impurity-doped floating regions in the lower portion of the epitaxial layer in the ring region R (e.g., under a p-rich condition).

The present application claims priority to Korean Patent Application No. 10-2021-0049522, filed on Apr. 16, 2021, the entire contents of which are incorporated herein by reference.

BACKGROUND ART

For high voltage power MOSFETs, the specific resistance and thickness of a drift region should be increased in order to increase a breakdown voltage to improve high voltage characteristics, and since the breakdown voltage is proportional to an on-resistance, there is a problem that the on-resistance increases as the breakdown voltage increases.

To solve this, a superjunction power MOSFET including alternating p-type regions and n-type regions under an active region has been introduced. Alternating p-type and n-type regions are ideal for charge balancing, so that they deplete each other under reverse voltage conditions, thereby making them more resistant to breakdown. Accordingly, the use of superjunction power MOSFETs having P pillar stripe regions and high voltage and low on-resistance characteristics compared to existing planar power MOSFETs is increasing.

FIG. 1 is a schematic cross-sectional view of a conventional superjunction semiconductor device.

Referring to FIG. 1, in the conventional superjunction semiconductor device 9, first conductivity type pillar regions 930 are arranged in a width direction in a second conductivity type epitaxial layer 910. Theoretically, a depletion layer is formed along the bonding surface of the epitaxial layer 910 and the pillar regions 930, the depletion layer easily expands laterally, and the drift region including the epitaxial layer 910 and the pillar regions 930 is completely changed to the depletion layer region to relax and extend the electric field concentration to a wide region. Thus, by securing a high breakdown voltage (BV), the forward characteristics of the device may be improved.

Generally, in a semiconductor device, it is necessary to design an efficient electric field dispersion structure to have a low on-resistance while maintaining a high breakdown voltage, whereas in a superjunction semiconductor device, the breakdown voltage in the cell region C is designed to be lower than the breakdown voltage in the ring region R. To be specific, in the superjunction semiconductor device, the breakdown voltage characteristics are determined by the epitaxial layer 910 and the pillar region 930, and stable characteristics of unclamped inductive switching (UIS) may be obtained only when the UIS is determined in the cell region C, where the area is relatively large and the current path is formed. However, when the breakdown voltage of the cell region C and the breakdown voltage of the ring region R are close to each other, there is a possibility that the breakdown voltage characteristics of the ring region are expressed, which is a factor that deteriorates the UIS characteristics.

In addition, in the case of the conventional superjunction semiconductor device 9, under a p-rich condition, an electric field concentration may occur since a lateral electric field applied to the ring region R is not sufficiently dispersed to the lower end of the epitaxial layer 910. This degrades the overall breakdown voltage characteristics of the device. That is, it can be a major factor in the expression of the above-described ring region breakdown voltage characteristics.

To solve such problems, the present disclosure intends to present a novel superjunction semiconductor device having an improved structure and a method for manufacturing the same.

DOCUMENT OF RELATED ART

Korean Patent Application Publication No. 10-2005-0052597, "SUPERJUNCTION SEMICONDUCTOR DEVICE"

DISCLOSURE

Technical Problem

The present disclosure has been made to solve the problems of the related art, and an objective of the present disclosure is to provide a superjunction semiconductor device and a method for manufacturing the same, which improve breakdown voltage characteristics of the device by effectively dispersing a lateral electric field in a ring region R (e.g., in the lower portion of an epitaxial layer) by forming first conductivity type floating regions in the lower portion of the epitaxial layer in the ring region R under a p-rich condition.

Moreover, an objective of the present disclosure is to provide a superjunction semiconductor device and a method for manufacturing the same capable of improving breakdown voltage characteristics without reducing on-resistance characteristics (e.g., because structural changes in the cell region to improve the breakdown voltage characteristics are not required).

Furthermore, an objective of the present disclosure is to provide a superjunction semiconductor device and a method for manufacturing the same, which facilitate fabrication by improving the breakdown voltage characteristics in a way that forms the first conductivity type floating regions on one side or in certain layer(s) of the epitaxial layer in the ring region.

TECHNICAL SOLUTION

The present disclosure may be implemented by one or more embodiments having the following configurations in order to achieve the above-described objectives.

According to one or more embodiments of the present disclosure, a superjunction semiconductor device of the present disclosure may include a substrate; an epitaxial layer on the substrate; a plurality of pillar regions spaced apart from each other along a width direction in the epitaxial layer; a gate insulating film on the epitaxial layer; a gate electrode on the gate insulating film; and a floating region in a lower part of the epitaxial layer in a ring region (e.g., of the superjunction semiconductor device). The superjunction semiconductor device may also include a separate cell region, and portions of the substrate may be designated as the cell region and the ring region.

According to one or more other or further embodiments of the present disclosure, the superjunction semiconductor device of the present disclosure may further include a body region in the epitaxial layer in the cell region and connected to a corresponding one of the pillar regions; and a source region in the body region.

According to yet one or more other or further embodiments of the present disclosure, in the superjunction semiconductor device of the present disclosure, the floating region may be deeper than or below adjacent pillar regions in the ring region.

According to yet one or more other or further embodiments of the present disclosure, in the superjunction semiconductor device of the present disclosure, the floating region may be in a space between adjacent pillar regions in the ring region.

According to yet one or more other or further embodiments of the present disclosure, in the superjunction semiconductor device of the present disclosure, a plurality of the floating regions are in or below spaces between adjacent pillar regions in the ring region.

According to yet one or more other or further embodiments of the present disclosure, in the superjunction semiconductor device of the present disclosure, a number of the floating regions may be less than a number of spaces between adjacent pillar regions in the ring region.

According to yet one or more other or further embodiments of the present disclosure, a superjunction semiconductor device of the present disclosure includes a substrate; a drain electrode on, in or under the substrate; an epitaxial layer on the substrate; a plurality of pillar regions spaced apart from each other along a width direction in the epitaxial layer and extending downward to a predetermined depth; a gate insulating film on the epitaxial layer; a gate electrode on the gate insulating film; and a floating region having a lowermost surface below the pillar regions in the epitaxial layer in a ring region (e.g., of the superjunction semiconductor device), wherein a center of the floating region may not overlap with adjacent ones of the pillar regions in a vertical direction.

According to yet one or more other or further embodiments of the present disclosure, the superjunction semiconductor device of the present disclosure may comprise two or more of the floating regions between each pair of the adjacent pillar regions.

According to yet one or more other or further embodiments of the present disclosure, in the superjunction semiconductor device of the present disclosure, the floating region may be in the epitaxial layer in the ring region adjacent to an interface with the cell region.

According to yet one or more other or further embodiments of the present disclosure, in the superjunction semiconductor device of the present disclosure, the floating region may have a doping concentration substantially identical to each of the pillar regions.

According to one or more embodiments of the present disclosure, a method for manufacturing a superjunction semiconductor device of the present disclosure includes forming a second conductivity type epitaxial layer on a substrate; forming a first conductivity type floating region in a lower portion of the epitaxial layer in a ring region (e.g., of the superjunction semiconductor device); forming first conductivity type pillar regions in the epitaxial layer, spaced apart in a width direction; forming a gate insulating film on the epitaxial layer; forming a gate electrode on the gate insulating film; and forming a first conductivity type body region in the epitaxial layer in a cell region (e.g., of the superjunction semiconductor device).

According to one or more other or further embodiments of the present disclosure, in the method for manufacturing a superjunction semiconductor device of the present disclosure, forming the epitaxial layer may include: forming a first epitaxial layer including second conductivity type impurities on the substrate; and repeatedly forming a second epitaxial layer including the second conductivity type impurities on or over the first epitaxial layer, and forming the floating region may include forming a first implant layer on or in the first epitaxial layer; and forming the floating region using a diffusion process after forming the second epitaxial layers.

According to yet embodiments of the present disclosure, in the method for manufacturing a superjunction semiconductor device of the present disclosure, forming the pillar regions may include forming a second implant layer on or in each of the second epitaxial layers; and forming the pillar regions using the diffusion process after forming the second epitaxial layers.

According to yet one or more other or further embodiments of the present disclosure, in the method for manufacturing a superjunction semiconductor device of the present disclosure, each of the first and second implant layers may comprise first conductivity type impurities, and a first conductivity type impurity-doped region of the first implant layer may not overlap or may only partially overlap first conductivity type impurity-doped regions of the second implant layers.

According to yet one or more other or further embodiments of the present disclosure, in the method for manufacturing a superjunction semiconductor device of the present disclosure, forming the body region may include forming a second conductivity type source region in the body region; and forming a first conductivity type body contact in the body region and in or adjacent to the source region.

According to yet one or more other or further embodiments of the present disclosure, in the method for manufacturing a superjunction semiconductor device of the present disclosure, forming the floating region may comprise forming a plurality of the floating regions spaced apart from each other between adjacent ones of the pillar regions.

According to yet one or more other or further embodiments of the present disclosure, a method for manufacturing a superjunction semiconductor device of the present disclosure includes forming a second conductivity type epitaxial layer on a substrate; forming a plurality of first conductivity type floating regions on or in a lower portion of the epitaxial layer in a ring region (e.g., of the superjunction semiconductor device); forming first conductivity type pillar regions that are spaced apart in a width direction in the epitaxial layer; forming a gate insulating film on the epitaxial layer; forming a gate electrode on the gate insulating film; and forming a first conductivity type body region in the epitaxial layer in a cell region (e.g., of the superjunction semiconductor device). In the superjunction semiconductor device, two or more of the floating regions may be between adjacent pillar regions.

Advantageous Effects

The present disclosure has the following effects by the above configurations.

The present disclosure can improve breakdown voltage characteristics of the device by effectively dispersing a lateral electric field in a ring region R in the lower portion of an epitaxial layer by forming first conductivity type floating impurity-doped regions in the lower portion of the epitaxial layer in the ring region R under a p-rich condition.

In addition, the present device and method can improve breakdown voltage characteristics without reducing on-resistance characteristics because structural changes in the cell region to improve the breakdown voltage characteristics are not required.

Furthermore, the present disclosure can facilitate fabrication by improving the breakdown voltage characteristics in a way that forms the first conductivity type floating regions on one side (e.g., in a lower region or in one or more lower layers) of the epitaxial layer in the ring region.

Meanwhile, it should be added that even if certain effects are not explicitly mentioned herein, the effects described in the following specification expected by the technical features of the present disclosure and their potential effects are treated as if they were described herein.

DETAILED DESCRIPTION

Hereinafter, embodiments of the present disclosure will be described in more detail with reference to the accompanying drawings. The embodiments may be modified in various forms, and the scope of the present disclosure should not be construed as being limited to the following embodiments, but should be construed based on the matters described in the claims. In addition, these embodiments are provided for reference in order to more completely explain the present disclosure to those of ordinary skill in the art.

As used herein, the singular form may include the plural form unless the context clearly dictates otherwise. Furthermore, as used herein, "comprise" and/or "comprising" refers to the existence of the recited shapes, numbers, steps, actions, members, elements and/or groups thereof, and does not exclude the presence or addition of one or more other shapes, numbers, actions, members, elements and/or groups.

Hereinafter, it should be noted that when one component (or layer) is described as being on another component (or layer), one component may be directly on the other component, or another component(s) or layer(s) may be between the components. In addition, when one component is expressed as being directly on or above another component, no other component(s) are between the components. Moreover, the terms "on top of", "upper", "lower", "below," or "on one (first) side" of a component may refer to a relative positional relationship.

The terms first, second, third, etc., may be used to describe various items such as various elements, regions and/or parts. However, the items are not limited by these terms.

In addition, it should be noted that, where certain embodiments are otherwise feasible, certain process sequences may be performed other than as described below. For example, two processes described in succession may be performed substantially simultaneously or in the reverse order.

Furthermore, the conductivity type or doped region of the components may be defined as "p-type" or "n-type" according to the main carrier characteristics, but this is only for convenience of description, and the technical spirit of the present disclosure is not limited to what is illustrated. For example, hereinafter, "p-type" or "n-type" may be replaced with the more general terms "first conductivity type" or "second conductivity type". For example, "first conductivity type" may refer to p-type, and "second conductivity type" may refer to n-type.

Furthermore, it should be understood that "high concentration" and "low concentration" relating to the doping concentration of an impurity region refers to a relative doping concentration of the impurity region.

Figure 2:
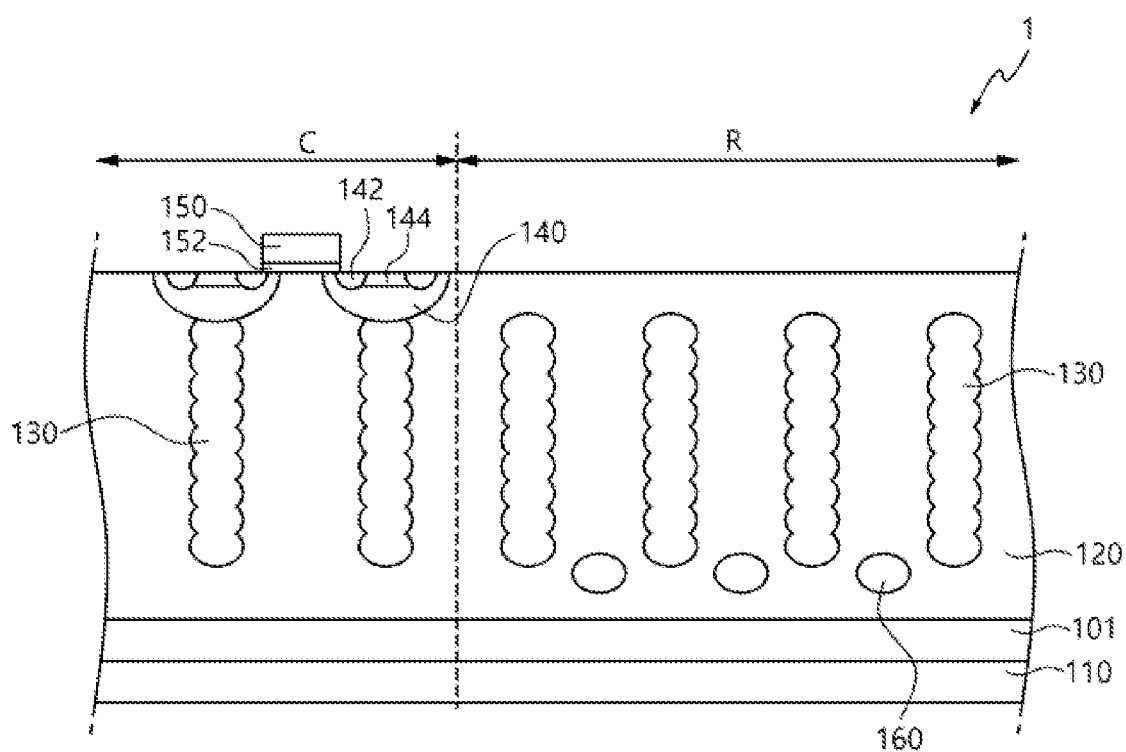
FIG. 2 is a cross-sectional view of a superjunction semiconductor device according to one or more embodiments of the present disclosure.

FIG. 2 is a cross-sectional view of a superjunction semiconductor device according to one or more embodiments of the present disclosure.

Hereinafter, a superjunction semiconductor device according to one or more embodiments of the present disclosure will be described in detail with reference to the accompanying drawings.

Referring to FIG. 2, the present disclosure relates to a superjunction semiconductor device 1 and, more particularly, to a superjunction semiconductor device that improves breakdown voltage characteristics of the device by effectively dispersing a lateral electric field in a ring region R in the lower portion of an epitaxial layer by forming first conductivity type floating impurity-doped regions in the lower portion of the epitaxial layer in the ring region R under a p-rich condition.

In general, the superjunction semiconductor device 1 includes the cell region C, which is an active region, and a ring region R that is a termination region surrounding the cell region C. In addition, when the ratio of the total amount of first conductivity type (e.g., p-type) impurities to the total amount of second conductivity type (e.g., n-type) impurities in the device is less than 1, that may be an "n-rich" condition, and when the ratio exceeds 1, that may be a "p-rich" condition.

First, the substrate 101 may be made of or comprise, for example, single crystal silicon, and the substrate 101 may include a bulk silicon wafer. The substrate 101 may also comprise, for example, a high-concentration second conductivity type substrate. A drain electrode 110 may be formed under (e.g., on one major surface of) the substrate 101.

On the substrate 101, an epitaxial layer 120 may be formed in the cell region C and the ring region R. The epitaxial layer 120 may be or comprise, for example, a lightly doped second conductivity type region. Pillar regions 130 may be formed in the epitaxial layer 120. The pillar regions 130 comprise, for example, a first conductivity type doped region, and may be spaced apart from each other in a lateral direction in the epitaxial layer 120. That is, the epitaxial layer 120 and the pillar regions 130 may alternate along the lateral direction. Additionally, the pillar regions 130 extend downward (e.g., through the epitaxial layer 120) a predetermined depth from the uppermost surface of the epitaxial layer 120, and may have curved surfaces in contact with the epitaxial layer 120. Opposite lateral surfaces of the pillar regions 130 may curve in opposite directions, or may extend substantially linearly downward, but are not limited thereto. That is, the scope of the present disclosure is not limited by the shape of the pillar regions 130 shown in FIG. 2.

In addition, in the cell region C, a body region 140 may be formed on each of the individual pillar regions 130 in the epitaxial layer 120. Accordingly, the pillar regions 130 and the body regions 140 in the cell region C match each other in a one-to-one relationship, and may be interconnected. The body regions 140 may be or comprise, for example, a first conductivity type impurity-doped region. One or more source regions 142 may be formed in each of the body regions 140. The source regions 142 may comprise, for example, a heavily doped second conductivity type region, and in each body region 140, one or two source regions 142 may be formed.

When two source regions 142 are formed in the body region 140, current paths may be formed along opposite surfaces of the individual pillar regions 130. Additionally, a body contact 144 may be formed in or on each of the body regions 140 and adjacent to or in contact with the source region(s) 142. The body contacts 144 may be or comprise, for example, a heavily doped first conductivity type region.

In the cell region C, a gate electrode 150 is formed on or over the epitaxial layer 120. The gate electrode 150 may comprise, for example, conductive polysilicon, a metal, a conductive metal nitride, or a combination thereof. A gate insulating film 152 may be formed on the epitaxial layer 120, and the gate electrode 150 may be formed on the gate insulating film 152. The gate insulating film 152 may comprise, for example, a silicon oxide film (e.g., thermally-grown silicon dioxide), a high-k dielectric film, or a combination thereof, but is not limited thereto.

In addition, in the ring region R, a first conductivity type floating region 160 may be formed in a lower layer or region of the epitaxial layer 120, adjacent to the bottom or lowermost surface. The floating region 160 may have substantially the same doping concentration as that of the pillar regions 130, but there is no limitation thereto.

Hereinafter, the structure of the conventional superjunction semiconductor device 9 and problems thereof, and the structure of the semiconductor device 1 according to one or more embodiments of the present disclosure for solving these problems will be described.

Figure 1:
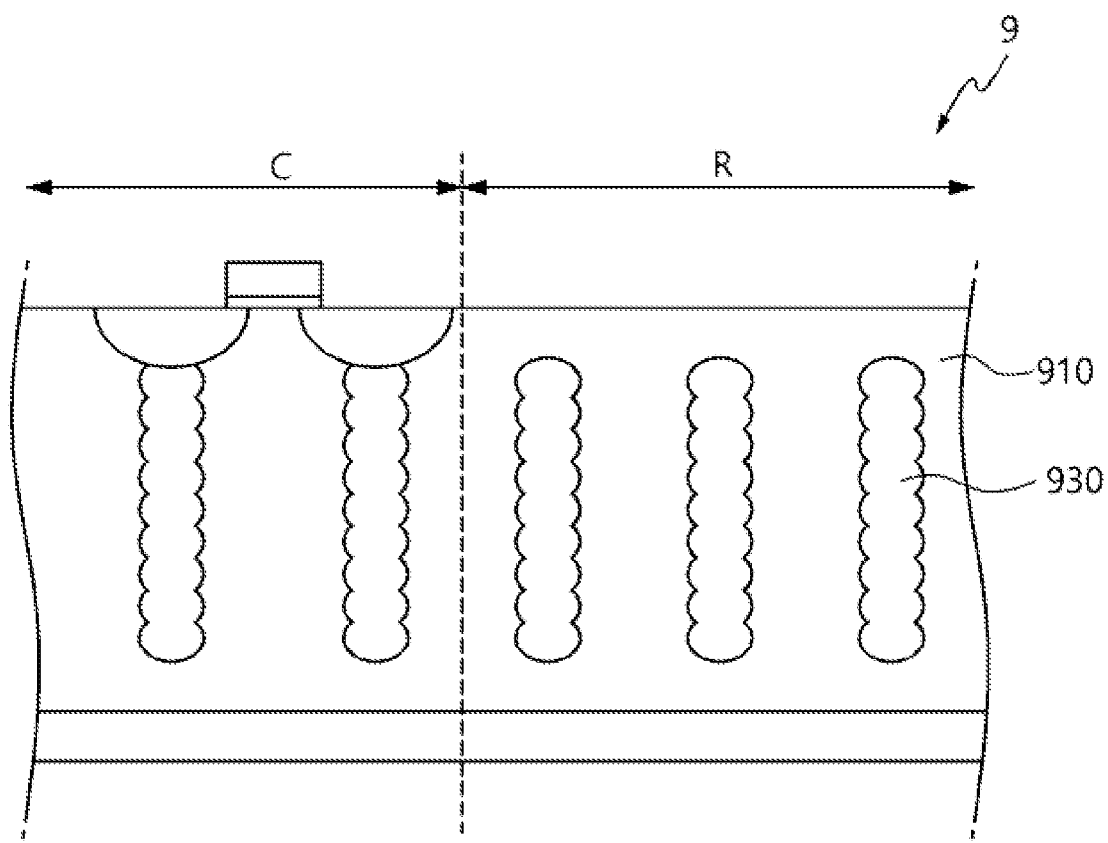
FIG. 1 is a schematic cross-sectional view of a typical superjunction semiconductor device.

Referring to FIG. 1, in the conventional superjunction semiconductor device 9, first conductivity type pillar region regions 930 are arranged in a width direction in a second conductivity type epitaxial layer 910. Theoretically, a depletion layer is formed along the interfaces between the epitaxial layer 910 and the pillar regions 930, the depletion layer easily expands laterally, and the drift region including the epitaxial layer 910 and the pillar regions 930 is completely changed to the depletion layer so that the electric field concentration is widely extended and relaxed. Thus, by securing a high breakdown voltage (BV), the forward characteristics of the device may be improved.

Generally, in a semiconductor device, it is necessary to design an efficient electric field dispersion structure to have a low on-resistance while maintaining a high breakdown voltage, whereas in a superjunction semiconductor device, the breakdown voltage in the cell region C is designed to be lower than the breakdown voltage in the ring region R. To be specific, in the superjunction semiconductor device, the breakdown voltage characteristics are determined by the epitaxial layer 910 and the pillar region 930, and stable characteristics of unclamped inductive switching (UIS) may be obtained when UIS is determined in the cell region C where the area is relatively large and the current path is formed. However, when the breakdown voltage in the cell region C and the breakdown voltage in the ring region R are close to each other, there is a possibility that the breakdown voltage characteristics of the ring region are expressed, which is a factor that deteriorates the UIS characteristics.

In addition, in the case of the conventional superjunction semiconductor device 9, under a p-rich condition, electric field concentration may occur since a lateral electric field in the ring region R may not be sufficiently dispersed to the lower layer(s) or region of the epitaxial layer 910. This degrades the overall breakdown voltage characteristics of the device. That is, it can be a major factor in the expression of breakdown voltage characteristics in the ring region as described above.

In order to solve such problems, referring to FIG. 2, in the superjunction semiconductor device 1 according to one or more embodiments of the present disclosure, a high breakdown voltage is maintained without deterioration of on-resistance characteristics by effectively dispersing the lateral electric field in the epitaxial layer 120 in the ring region R to the lower layer(s) or lower region of the epitaxial layer 120 by forming first conductivity type floating impurity-doped regions 160 in the ring region R in the lower layer(s) or lower region of the epitaxial layer 120, adjacent to the lowermost surface. That is, under the p-rich condition, the breakdown voltage of the ring region R is maintained significantly larger than the breakdown voltage of the cell region C, thereby preventing deterioration of the UIS characteristics. Additionally, the floating regions 160 are preferably formed on the ring region R adjacent to the cell region C.

To explain it in more detail, the floating regions 160 may have a height below or a depth lower than the individual pillar regions 130 in the epitaxial layer 120 in the ring region R, and may be in or below the space between adjacent pillar regions 130 (e.g., in the vertical direction). In other words, the floating regions 160 may not overlap the pillar regions 130 in the vertical direction, or at least a center of each floating region 160 does not overlap any of the pillar regions 130 in the vertical direction. The floating regions 160 may be below the pillar regions 130 in the epitaxial layer 120. Alternatively, at least the bottommost surface of the floating regions 160 may be below the bottommost surface of the adjacent pillar regions 130. For example, one floating region 160 may be below the adjacent pillar regions 130 in a space between the adjacent pillar regions 130.

Figure 3:
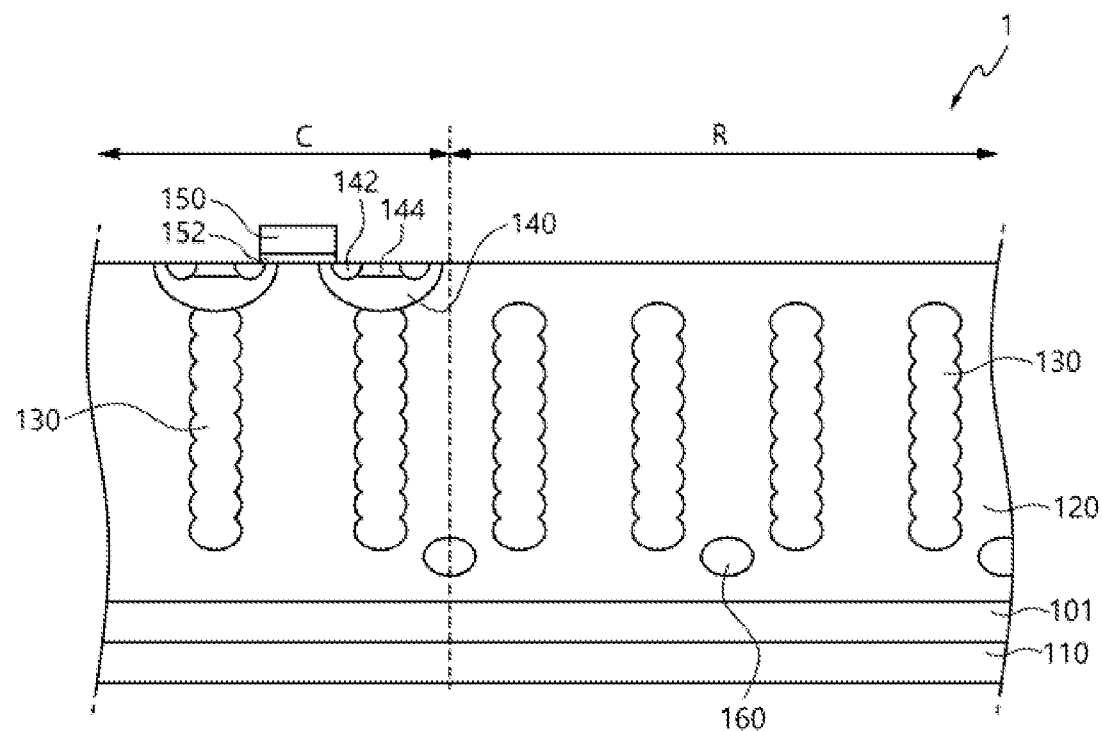
FIG. 3 is a cross-sectional view of a superjunction semiconductor device according to one or more other or further embodiments of the present disclosure.

FIG. 3 is a cross-sectional view of a superjunction semiconductor device according to one or more other or further embodiments of the present disclosure.

Referring to FIG. 3, the floating region 160 may be in some (but not all) of the spaces between adjacent pillar regions 130. That is, in the ring region R, the spaces between the adjacent pillar regions 130 and the floating region(s) 160 do not necessarily match one-to-one. For example, when floating region 160 is in a first space, it may not be in a second space adjacent to the first space, but may be in a third space adjacent to the second space. As such, the device 1 may have at least some regions below the spaces between adjacent pillar regions 130 that do not contain a floating region 160 in the ring region R.

Figure 4:
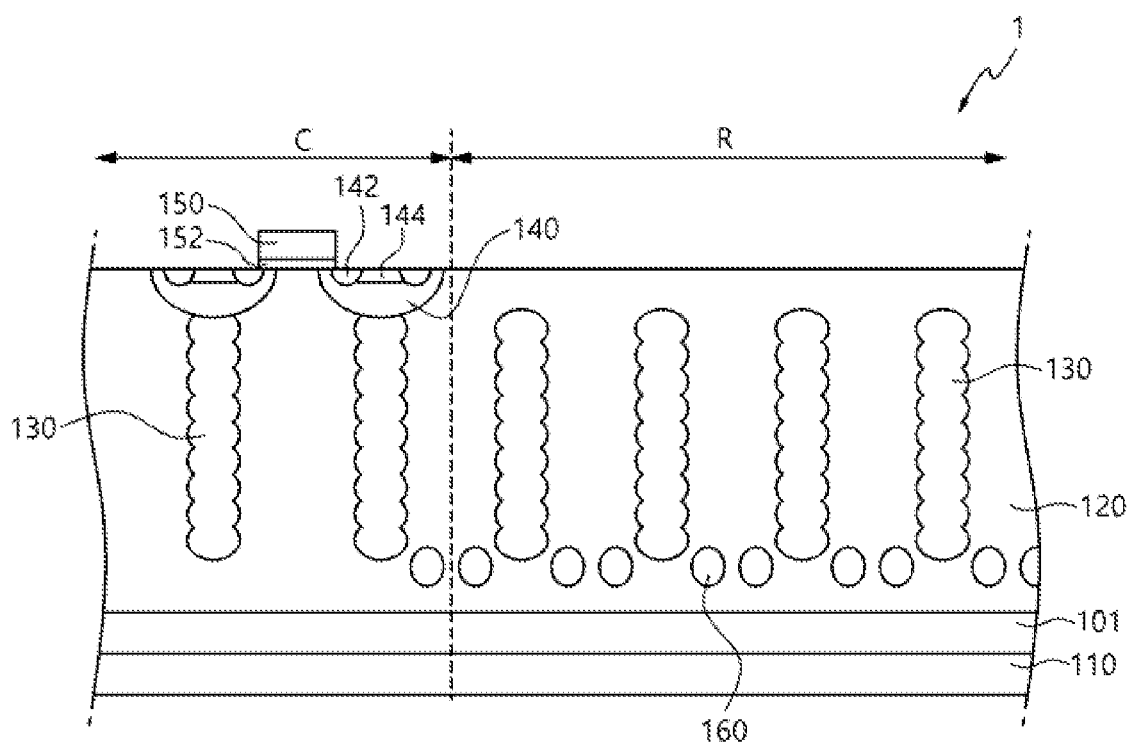
FIG. 4 is a cross-sectional view of a superjunction semiconductor device according to yet one or more other or further embodiments of the present disclosure.

FIG. 4 is a cross-sectional view of a superjunction semiconductor device according to yet one or more other or further embodiments of the present disclosure.

Referring to FIG. 4, two or more floating regions 160 may be formed in the space between adjacent pillar regions 130. That is, the device 1 may have two or more floating regions 160 between each pair of adjacent pillar regions 130. Alternatively, the first conductivity type impurity in a single floating region 160 (e.g., under all or substantially all of the pillar regions 130 in the ring region R) may have a relatively uniform doping concentration gradient.

Figure 5:
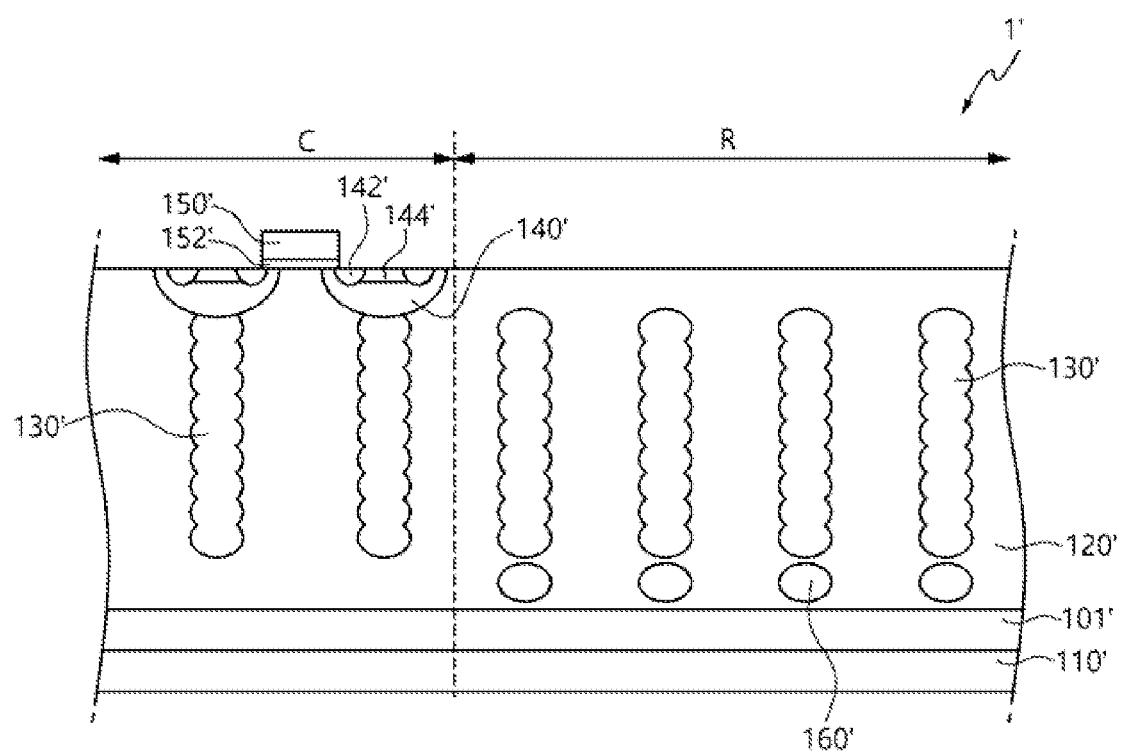
FIG. 5 is a cross-sectional view of a superjunction semiconductor device in which floating regions overlap lowermost surfaces of pillar regions.
Figure 6:
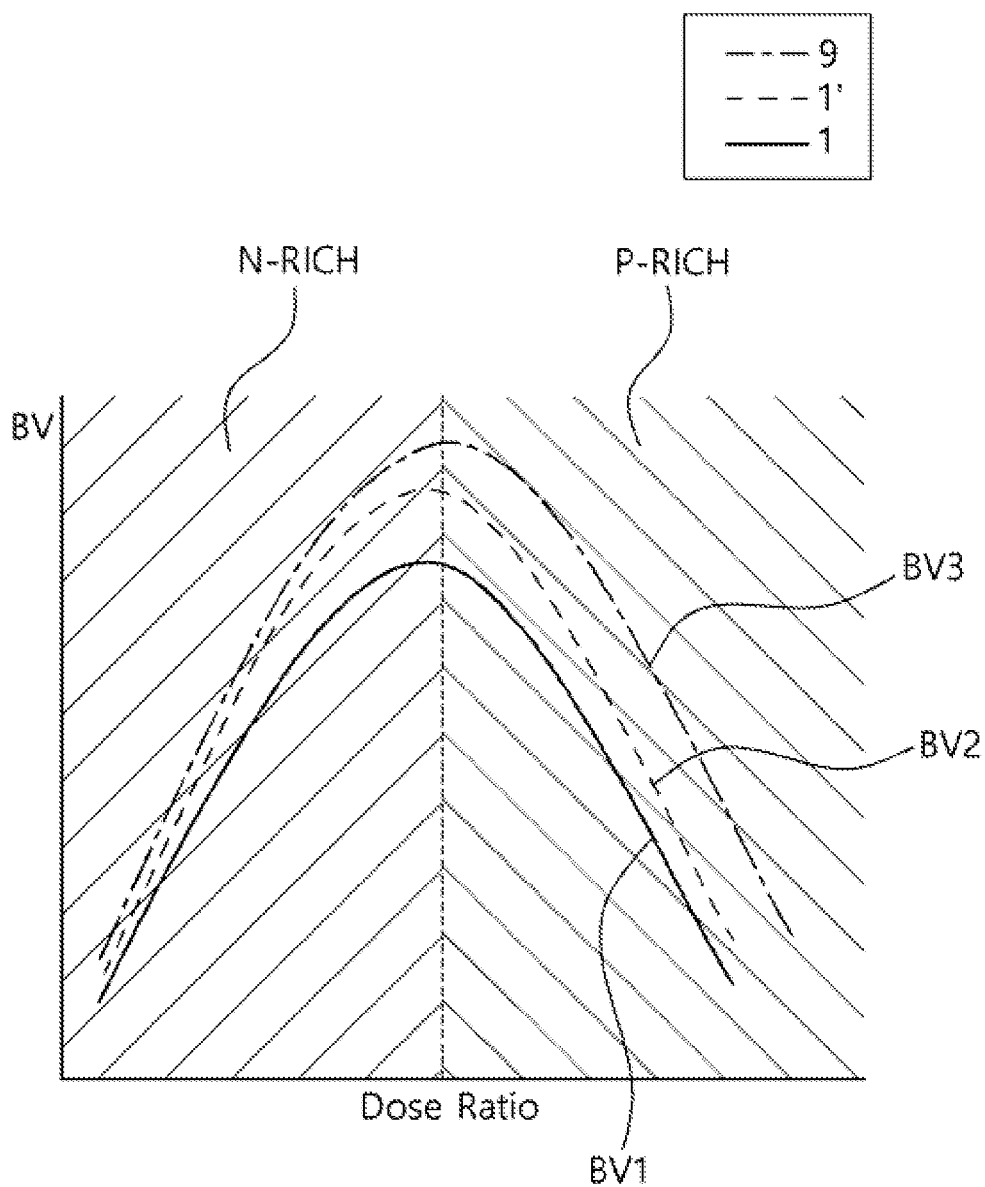
FIG. 6 is a graph showing a breakdown voltage according to a total impurity ratio in a superjunction semiconductor device according to one or more embodiments of the present disclosure compared to a conventional device.

FIG. 5 is a cross-sectional view of a superjunction semiconductor device in which floating regions are formed to overlap lowermost surfaces of pillar regions, and FIG. 6 is a graph showing a breakdown voltage according to a total impurity ratio in a superjunction semiconductor device according to one or more embodiments of the present disclosure compared to a conventional device.

Referring to FIG. 6, in the case of using the superjunction semiconductor device 1 according to one or more embodiments of the present disclosure, when compared with the conventional device 9 under p-rich conditions, it can be seen that the breakdown voltage BV3 is improved compared to the breakdown voltage BV1 of the conventional device 9. Additionally, when compared with the breakdown voltage BV2 of the device 1' (see FIG. 5) in which the floating region 160' overlaps a corresponding pillar region 130' in the vertical direction below the individual pillar region 130' in the ring region R, it can be seen that the breakdown voltage characteristics are significantly improved.

FIGS. 7 to 13 are cross-sectional views illustrating structures in a method of manufacturing a superjunction semiconductor device according to one or more embodiments of the present disclosure.

Hereinafter, a method for manufacturing a superjunction semiconductor device according to one or more embodiments of the present disclosure will be described in detail with reference to the accompanying drawings.

Figure 7:
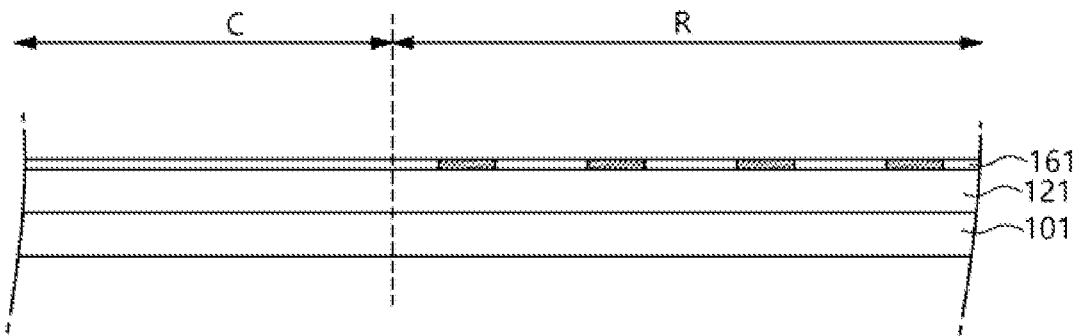
FIGS. 7 to 13 are cross-sectional views illustrating a method of manufacturing a superjunction semiconductor device according to one or more embodiments of the present disclosure.

First, referring to FIG. 7, a first epitaxial layer 121 is formed on the substrate 101. The first epitaxial layer 121 may be a second conductivity type impurity-doped layer. Then, a first implant layer 161 for forming floating regions 160 is formed on the first epitaxial layer 121. The first implant layer 161 may be formed using an ion implantation process after, for example, a mask pattern (not shown) having openings exposing areas of the first epitaxial layer 121 in which the floating regions 160 are to be formed is formed on the first epitaxial layer 121.

Figure 8:
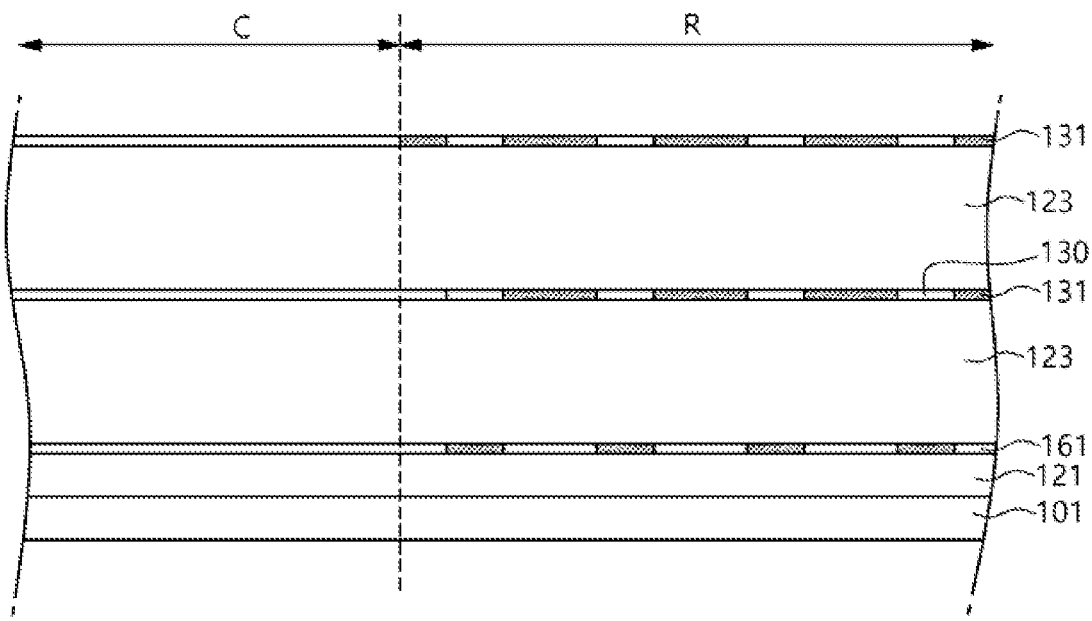

Thereafter, referring to FIG. 8, a second epitaxial layer 123 is formed on the first implant layer 161. Then, a second implant layer 131 for forming the pillar regions 130 is formed on the second epitaxial layer 123. The second implant layer 131 may be formed using an ion implantation process after, for example, a mask pattern (not shown) having openings exposing areas of the first epitaxial layer 121 in which the pillar regions 130 are to be formed is formed on the second epitaxial layer 123. In preferred embodiments, the openings in the mask pattern for the pillar regions 130 are not in the same locations as the openings in the mask pattern for the floating regions 160, although the invention is not limited to such a constraint. The second epitaxial layer 123 may also be a second conductivity type impurity doped layer.

Thereafter, another second epitaxial layer 123 and another second implant layer 131 are formed on the initial second epitaxial layer 123. In this way, successive second epitaxial layers 123 and second implant layers 131 are alternately repeatedly formed to a predetermined height or thickness. Although the structure in which two second epitaxial layers 123 are stacked is illustrated in FIG. 8, this is merely exemplary, and the number of alternating stacked second epitaxial layers 123 and second implant layers 131 is not particularly limited.

Figure 9:
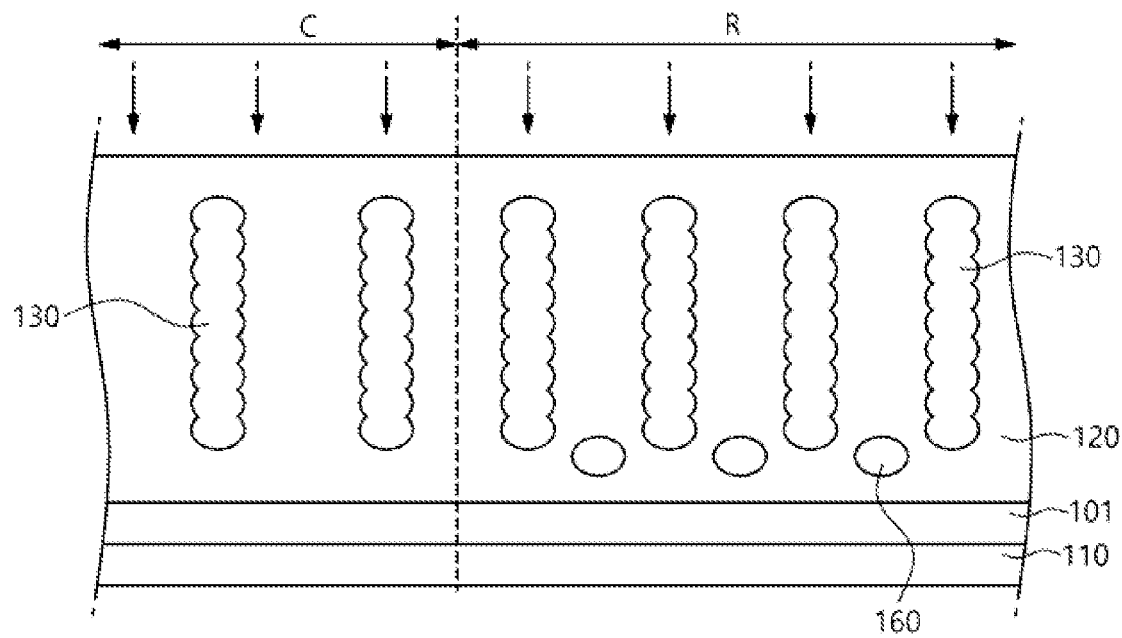

Thereafter, referring to FIG. 9, a diffusion process, for example, a thermal diffusion process, for forming the floating regions 160 and the pillar regions 130 in the epitaxial layer 120 may be performed. This step completes the formation of the second conductivity type epitaxial layer 120 on the substrate 101, the pillar regions 130 in the epitaxial layer 120, and the floating regions 160 in the epitaxial layer 120 in the ring region R. As previously described, the floating regions 160 may be formed below the individual pillar regions 130 or below the spaces between adjacent pillar regions 130 in the epitaxial layer 120 in the ring region R. That is, the floating regions 160 may not overlap the pillar regions 130 in the vertical direction, or at least a center of each floating region 160 does not overlap a corresponding pillar region 130 in the vertical direction. It should be noted that the aforementioned method of forming the pillar regions 130 and the floating regions 160 is for description only, and the scope of the present disclosure is not limited thereto.

Figure 10:
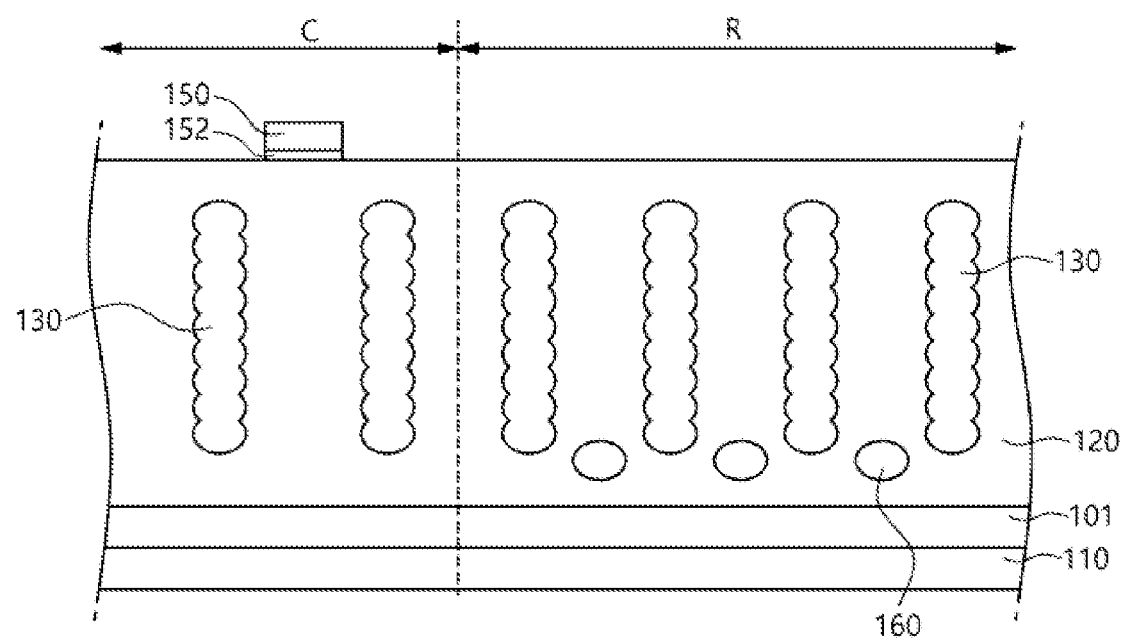

Thereafter, referring to FIG. 10, the gate insulating film 152 and the gate electrode 150 are formed on the epitaxial layer 120. After forming an insulating film layer (not shown) for forming the gate insulating film 152 on the surface of the epitaxial layer 120 and a gate film (not shown) on the insulating film layer (not shown), a mask pattern (not shown) is formed on the gate film, and an etching process is performed to remove the parts of the gate film and the insulating film layer exposed by the mask pattern. The gate electrode 160 may have, for example, a stripe shape (when viewed in a layout, or from the top).

Figure 11:
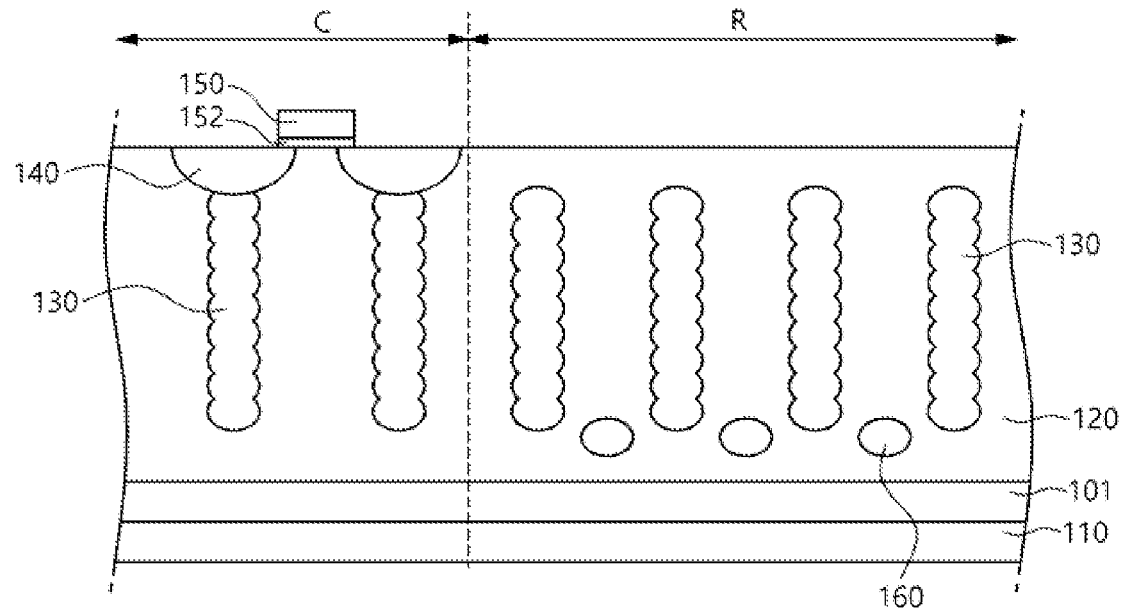

Thereafter, referring to FIG. 11, the body regions 140 are formed in the epitaxial layer 120 in the cell region C. The body regions 140 may be formed, for example, by ion implantation of first conductivity type impurities using (at least in part) the gate electrodes 150 as a mask pattern, but is not limited thereto.

Figure 12:
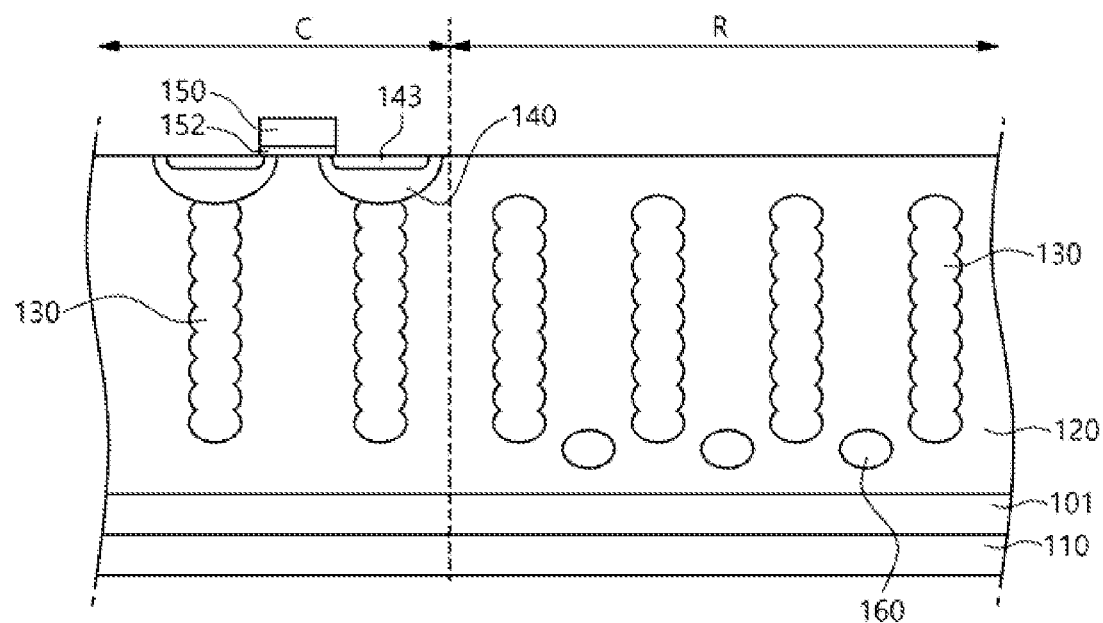
Figure 13:
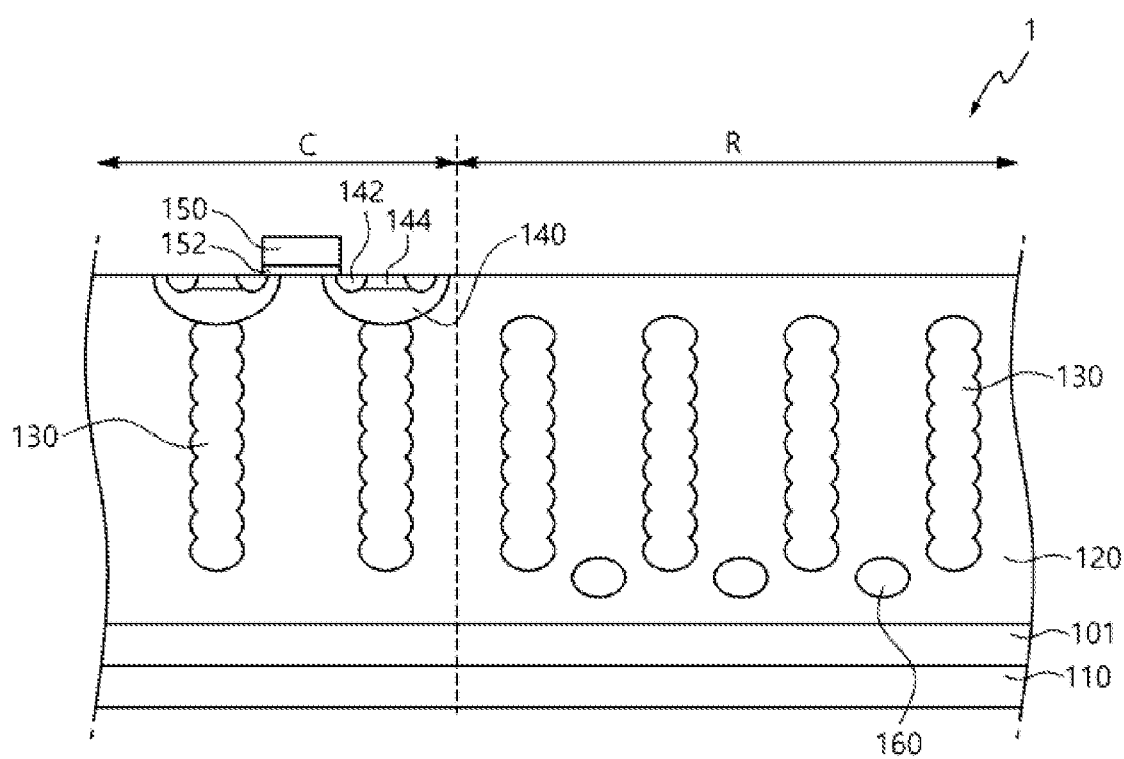

Thereafter, referring to FIG. 12, in order to form the source region(s) 142 in the body region 140, a second conductivity type impurity region 143 is formed by ion-implantation (e.g., using the gate electrodes and a mask pattern to expose the surfaces of the body regions 140 in which the source region[s] 142 are formed). Then, referring to FIG. 13, the body contacts 144 may be formed by ion-implanting a first conductivity type impurity into the source region 142 and the body region 140 (e.g., using a mask pattern to expose the surfaces of the source region[s] 142 and optionally the body regions 140 in which the body contacts 144 are formed).

The above detailed description is illustrative of the present disclosure. In addition, the above description shows and describes certain embodiments of the present disclosure, and the present disclosure can be used in various other combinations, modifications, and environments. That is, changes or modifications are possible within the scope of the concepts of the disclosure disclosed herein, a scope equivalent to the written disclosure, and/or within the scope of skill or knowledge in the art. The above-described embodiments describe the best state for implementing the technical ideas of the present disclosure, and various changes for specific application fields and uses of the present disclosure are possible. Accordingly, the detailed description of the present disclosure is not intended to limit the present disclosure to the disclosed embodiments.

The invention claimed is:

1. A superjunction semiconductor device, comprising:
a cell region;
a ring region surrounding the cell region;
a substrate;
an epitaxial layer on the substrate;
a plurality of pillar regions spaced apart from each other along a width direction in the epitaxial layer, the cell region and the ring region;
a gate insulating film on the epitaxial layer;
a gate electrode on the gate insulating film; and
a plurality of floating regions in the ring region, each having a lowermost surface below the plurality of pillar regions and an uppermost surface overlapping with the plurality of pillar regions in the width direction,
wherein each of the plurality of floating regions has a center that does not overlap with adjacent ones of the plurality of pillar regions in a vertical direction.

2. The superjunction semiconductor device of claim 1, further comprising:
a body region in the epitaxial layer in the cell region of the superjunction semiconductor device and connected to a corresponding one of the pillar regions; and
a source region in the body region.

3. The superjunction semiconductor device of claim 1, wherein each of the plurality of floating regions is in a space between adjacent pillar regions in the ring region.

4. The superjunction semiconductor device of claim 1, wherein a plurality of the floating regions are in or below spaces between adjacent ones of the plurality of pillar regions.

5. The superjunction semiconductor device of claim 1, wherein a number of the plurality of floating regions is less than a number of spaces between adjacent ones of the plurality of pillar regions in the ring region.

6. A superjunction semiconductor device, comprising:
a cell region;
a ring region surrounding the cell region;
a substrate;
a drain electrode under the substrate;
an epitaxial layer on the substrate;
a plurality of pillar regions spaced apart from each other along a width direction in the epitaxial layer, the cell region and the ring region, and extending downward to a predetermined depth;
a gate insulating film on the epitaxial layer;
a gate electrode on the gate insulating film; and
a plurality of floating regions having a lowermost surface below the plurality of pillar regions in the ring region,
wherein a center of each of the plurality of floating regions does not overlap with adjacent ones of the plurality of pillar regions in a vertical direction, and
one of the plurality of floating regions is at an interface between the cell region and the ring region.

7. The superjunction semiconductor device of claim 6, comprising at least two or more of the floating regions between each pair of the adjacent pillar regions.

8. The superjunction semiconductor device of claim 6, wherein the plurality of floating regions have a doping concentration identical to each of the pillar regions.

* * * * *